United States Patent
Tului et al.

(10) Patent No.: US 7,070,857 B2
(45) Date of Patent: Jul. 4, 2006

(54) COMPOSITE WITH A LOW EMISSIVITY IN THE MEDIUM AND FAR INFRARED, AND WITH A LOW REFLECTIVITY IN THE VISIBLE AND NEAR INFRARED

(75) Inventors: Mario Tului, Rome (IT); Roberta Valle, Rome (IT); Flavio Mortoni, Turin (IT); Marco Protti, Turin (IT)

(73) Assignees: Centro Sviluppo Materiali S.p.A., Rome (IT); Alenia Aeronautica S.p.A., Napoli (IT)

(*) Notice: Subject to any disclaimer, the term of this patent is extended or adjusted under 35 U.S.C. 154(b) by 0 days.

(21) Appl. No.: 10/324,125

(22) Filed: Dec. 20, 2002

(65) Prior Publication Data
US 2004/0106002 A1   Jun. 3, 2004

(30) Foreign Application Priority Data
Dec. 20, 2001   (IT)   .......................... RM2001A0751

(51) Int. Cl.
*B32B 9/04*   (2006.01)

(52) U.S. Cl. ...................... 428/408; 428/469; 428/697; 428/699; 428/701; 428/702

(58) Field of Classification Search ................ 428/615, 428/620, 621, 628, 629, 632, 639, 690, 369, 428/367, 368, 375, 446, 457, 469, 472, 688, 428/689, 698, 699, 701, 702; 427/255.28, 427/255.32, 255.33, 255.34, 255.35, 255.36, 427/255.37, 419.1, 419.2, 419.3
See application file for complete search history.

(56) References Cited

U.S. PATENT DOCUMENTS

| | | | | |
|---|---|---|---|---|
| 4,011,190 A | * | 3/1977 | Telkes | 523/135 |
| 4,514,437 A | * | 4/1985 | Nath | 427/566 |
| 5,279,681 A | * | 1/1994 | Matsuda et al. | 136/255 |
| 5,720,826 A | * | 2/1998 | Hayashi et al. | 136/249 |

* cited by examiner

*Primary Examiner*—Stephen Stein
(74) *Attorney, Agent, or Firm*—Browdy & Neimark, PLLC

(57) ABSTRACT

Multi-layer composite product, featuring low emissivity in the mid-infrared band (as wavelength range 2,5–5 μm) and far-infrared (as wavelength range 8.0–14.0 μm) bands, as well as low reflexivity in the near-infrared (at a wavelength range of 0.7–2.5 μm) and in the visible (as wavelength range 0.3–0.7 μm) bands, including a base constructed with low-density and/or high thermal-resilience structural materials, covered with optionally doped coating, and where, between the base and the coating, at least one intermediate layer of metals or metal oxides is planned for insertion.

1 Claim, 5 Drawing Sheets

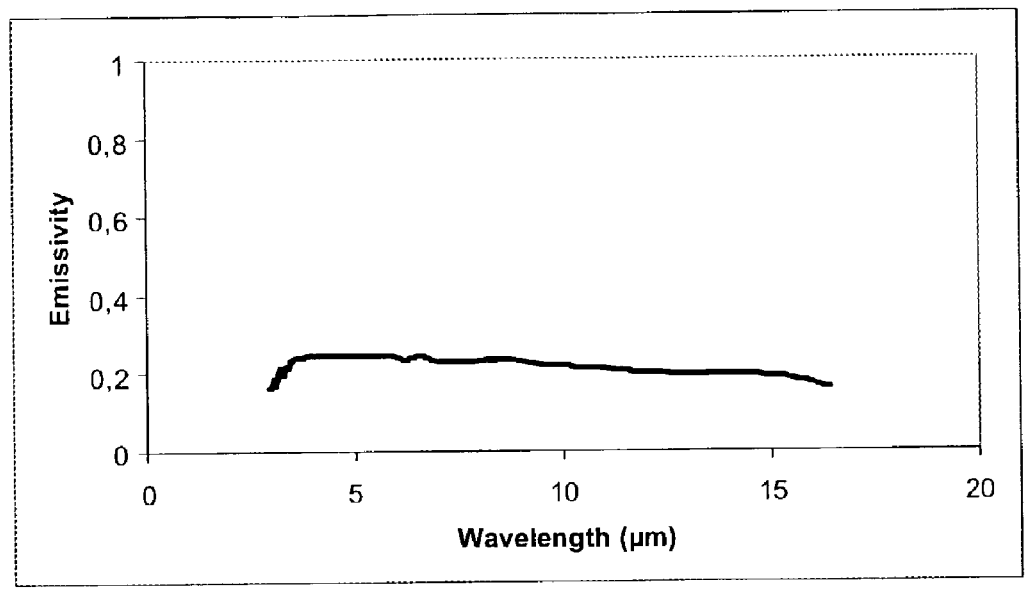
Fig. 6
Fig. 7
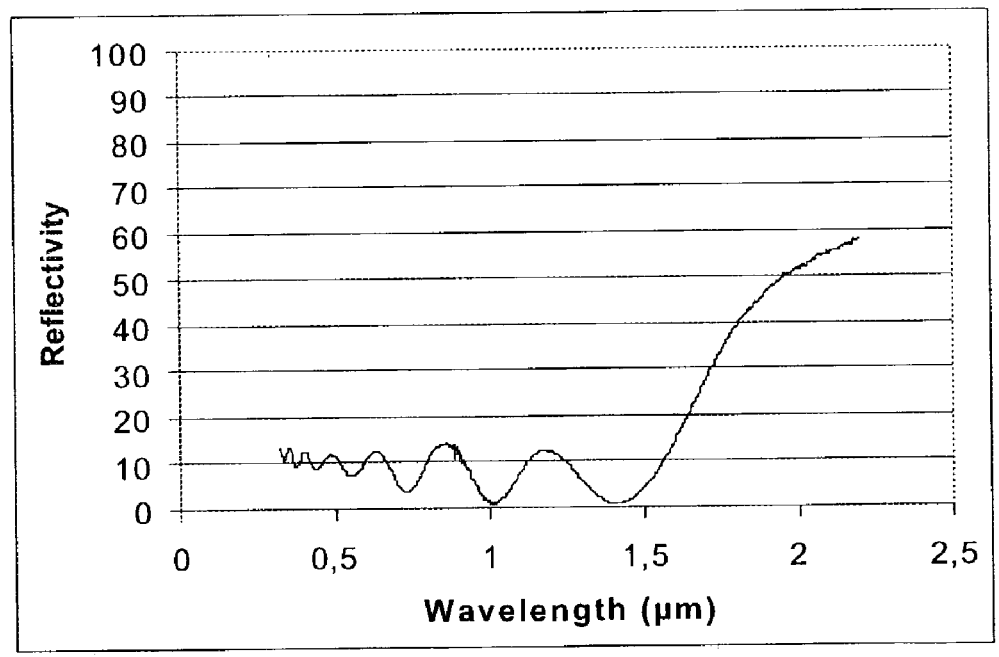

COMPOSITE WITH A LOW EMISSIVITY IN THE MEDIUM AND FAR INFRARED, AND WITH A LOW REFLECTIVITY IN THE VISIBLE AND NEAR INFRARED

BACKGROUND OF THE INVENTION

1. Field of Invention

This invention refers to products intended for the aeronautical industry featuring low infrared emissivity and low visible light reflexivity.

2. Description of the Prior Art

As it is generally known, with regard to coated products, the coating in question must have a high degree of adhesiveness and must withstand transitory mechanical and thermal stresses, which may cause its detachment.

A commonly employed solution relies upon the use of special varnishes containing particles of materials featuring the desired optical characteristics. However, the employment of such varnishes is considered not entirely satisfactory. Such varnishes, in fact, when exposed to their normal operating conditions, tend to rapidly deteriorate and erode, thus, rapidly degrading their properties, so that they have to be frequently reapplied. An example of coating of the above-mentioned type is described in the American patent U.S. Pat. No. 5,472,533.

As a result, the aeronautical industry needs to gain access to materials featuring a permanent modification of their surface optical properties.

SUMMARY OF INVENTION

This invention provides for the satisfaction of this need, supplying, in addition, other advantages, which shall hereafter become apparent.

As a matter of fact, this invention is a multi-layer composite product featuring low emissivity, particularly in the mid and far infrared bands, and low reflexivity in the visible and near infrared, while including a base constructed with low-density and/or high thermal-resilience structural materials. These materials are covered with a coating chosen from the group comprising the semiconductor oxides, which may be doped.

The invention's multi-layer composite product is capable of reducing mid- and far-infrared emissivity (between 2.5 and 4 µm and between 8 and 14 µm), by providing an average value lower than 0.4, while maintaining a low reflexivity in the visible band (neutral or grey coloration) and in the near-infrared (between 0.7 and 2.5 µm), by providing an average value lower than 0.3.

The low-density structural base material may be chosen from the group comprising Al, Al alloys, Ti, Ti alloys, polymer-matrix composites, carbon-fibre composites.

The low-density and high thermal-resilience structural base material may be a carbon-fibre composite, preferably of the C—C and C—SiC type.

The high thermal-resilience structural base material may be chosen from the group comprising steels, as well as Nickel and Cobalt super-alloys.

The doped oxide superconductors of the coating may be chosen from the group comprising $In_2O_3$ doped with Tin, $CdIn_2O_4$, $Zn_2In_2O_5$, ZnO doped with aluminum, ZnO doped with tin, $SnO_2$ doped with antimony, $SnO_2$ doped with fluorine, CdO doped with tin.

Between the base and the coating, an intermediate layer, chosen from the group comprising metals such as indium, cadmium, zinc, tin, aluminum, antimony or their alloys, as well as metal oxides such as indium, cadmium, zinc, tin, aluminum, titanium, tungsten which may be doped with elements such as tin, aluminum, antimony and fluorine, may also be inserted as an option.

The deposition of the coating and of any optional intermediate layers is obtained with dry deposition techniques, such as Vapour Deposition, Physical Vapour Deposition (PVD), Chemical Vapour Deposition (CVD) and Thermospraying, or by wet deposition, such as Chemical Deposition and Electro-deposition.

The main product and process advantage allowed by this invention resides in its ability to allow the deposition of metallic materials featuring the desired optical properties, which are capable of permanently bonding to the intended support.

The multi-layer composite product resulting from the invention has a multiplicity of applications.

For instance, it may be employed where it is necessary to maintain a reduced heat transfer occurring through radiation, such as that produced by the components of machines, devices and mechanical/electronic equipment, which, during their operating life, are subject to heating. In such cases, a high emissivity in the infrared field may affect devices and equipment adjacent to those subject to heating.

The use of these multi-layer composite products is also applicable to situations where it is necessary to prevent, especially in confined spaces, the onset of greenhouse effects, determined by solar or artificial illumination, producing an uncontrolled temperature increase in such spaces.

Another area where the invention can be applied is that of components that, during their operating life, are subject to attrition, in particular to air attrition. This occurs on the external surface of vehicles that are rapidly moving in the air and are subject to attrition, as well as to their parts. The localised temperature increase may determine a high wave emission in the infrared band, which may disturb adjacent electric or electronic equipment and/or allow for vehicle detection by monitoring systems and/or missile guidance systems.

Within the context of what was previously mentioned, the need to obtain low emissivity levels within the infrared may go with the need to obtain a low reflectivity in the visible and near-infrared bands, for instance in order to avoid having the reflection of natural or artificial external sources contribute to vehicle detection by monitoring systems and/or missile guidance systems.

The employment of the composite for the purposes of the invention is particularly suitable for the aircraft surfaces that are most subject to aerodynamic heating, such as the junction ends of the wings and of the control surfaces, the front end of the fuselage, and the air intakes.

This invention will be discussed hereinafter with regards to some of its preferred applications, which are provided as examples and are not at all exhaustive, while referring to the following examples and attached drawings.

BRIEF DESCRIPTION OF THE DRAWINGS

FIG. 6 shows the emissivity in the infrared obtained for the production of the third prototype of the composite for the purposes of the invention.

FIG. 7 shows the outcome of the reflectivity measurements taken for the production of the third prototype of the composite for the purposes of the invention.

DETAILED DESCRIPTION OF THE INVENTION

Figure 1:
FIG. 1 shows a microphotograph of the section obtained for the production of the first prototype of the composite for the purposes of the invention viewed using SEM (Scanning Electron Microscopy).

EB-PVD is one of the technologies employed to produce this type of coating. This vapour technology employs an electron gun in order to vaporize the materials to be deposited, and allows for the deposition of layers some hundreds of nanometers thick in a few minutes.

To obtain differentiated values of spectrum emissivity in the infrared and visible bands and to produce surface layers capable of withstanding their operating stresses (wear and corrosion), thin coatings more than 100 μm thick and well adherent to their substrates or bases were produced using PVD (Physical Vapour Deposition) technology.

PVD Evaporation technologies consist of vacuum evaporation processes ($10^{-5}$ Pa) of a solid material with subsequent condensation of the substrate vapour to be coated. In those processes where heating occurs by electrical resistance, the material to be evaporated is contained in a refractory metal crucible that is heated up to the evaporation temperature, while letting high amperage currents through.

Another production process involves an electronic gun, aimed at evaporating the coating material, and the use of a magnetic field to direct the electron-beam into the crucible. This method allows for the deposition of metals whose vapour tension is relatively low, such as Al, Ti, Pt or W, as well as the deposition of some insulating materials, such as $Al_2O_3$ and $SiO_2$. The components being produced are rotated inside a vaporising cloud during the process of deposition and are generally vacuum pre-heated.

In order to prevent the loss of the support's mechanical properties, the construction of the product related to this invention involved the resolution of two special issues regarding the aluminum base: coating adhesion and deposition temperature control.

The deposition was obtained using EB-PVD, since such technology allows for the production of fills whose thickness amounts to hundreds of nanometers in short spans of time. The coating/support adhesion problems, typical of this technology, were resolved by producing low-thickness fills and using a tin substrate, which was found to be useful to guarantee good adhesion to the support/base, particularly with aluminum.

To prevent the loss of the mechanical properties of the aluminum alloys due to the excessive heating of the substrate, rigorous control of the object's temperature (T<150° C.) was implemented during the process, both during pre-treatment (ion etching) and during deposition.

So far we have made a general description of this invention. With the help of the illustrations and examples that follow, we will now provide a more detailed description of the type of construction illustrated, with the aim of better understanding its purposes, features, advantages, and modes of application.

EXAMPLES

Various products were obtained by employing electronic-gun deposition equipment, operating through Physical Vapour Deposition, which allows for the monitoring of the substrate temperature during pre-treatment and deposition processes.

Example 1

(Aluminum-Alloy-Based Product, with Zinc Oxide Coating, Doped with Aluminum (AZO) and an Intermediate Layer of Tin).

The product was obtained using a procedure that will be described in detail below, by employing the evaporation PVD technology. Such procedure was optimised considering three general conditions:

Decrease in thickness, with the goal of diminishing the residual stresses;

Deposition of the various layers without opening the deposition chamber;

Process temperature kept well below 150° C. to prevent degradation of the mechanical properties of the base material.

The product was obtained using PVD evaporation technology as follows:

Chemical cleaning of the base material

Ion bombardment

Deposition of three subsequent substrates of tin, zinc and aluminum in sequence, by keeping the chamber at low pressure; an electrical resistance evaporator was used for the zinc, while the tin and aluminum were evaporated using an EB (Electron Beam) electronic gun.

Table I shows the process parameters used for the deposition of the product described above.

TABLE I

| | | Ion bombardment | | Deposition | | |
|---|---|---|---|---|---|---|
| Substrate | Coating material | Time (min.) | Temperature (° C.) | Time (s) | Temperature (° C.) | EB Power (Kw) |
| Al 2024 | Sn | 23 | <150 | 17 | <150 | 53 |
| | Zn | | | 30 | | Evaporator |
| | Al | | | 12 | | 58 |

The attached FIG. 1 shows a microphotograph of the section of the product, as described in this example and viewed using SEM (Scanning Electron Microscopy).

The structure of the zinc intermediate layer, typical of the resistance-induced PVD evaporation coating method, is made of open blades, which are suitable for oxidation, thus facilitating the development of the AZO surface layer.

Figure 2:
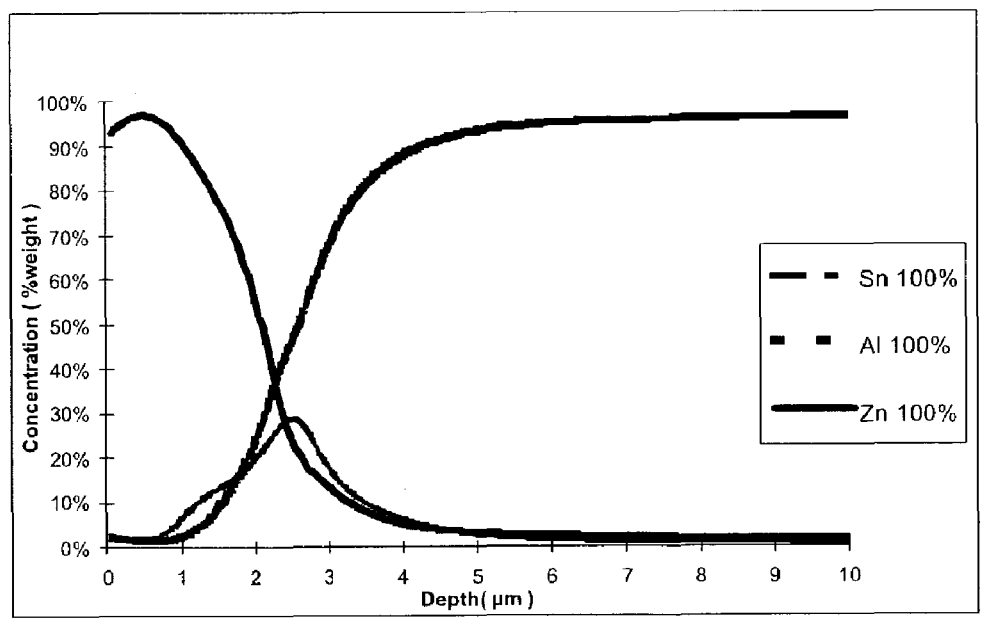
FIG. 2 shows the concentration profile, determined using the GDOES (Glow Discharge Optical Emission Spectroscopy) technique, obtained for the production of the first prototype of the composite for the purposes of the invention.

The attached FIG. 2 shows the concentration profile, determined using the GDOES (Glow Discharge Optical Emission Spectroscopy) technique, of the product being described in this example.

Figure 3:
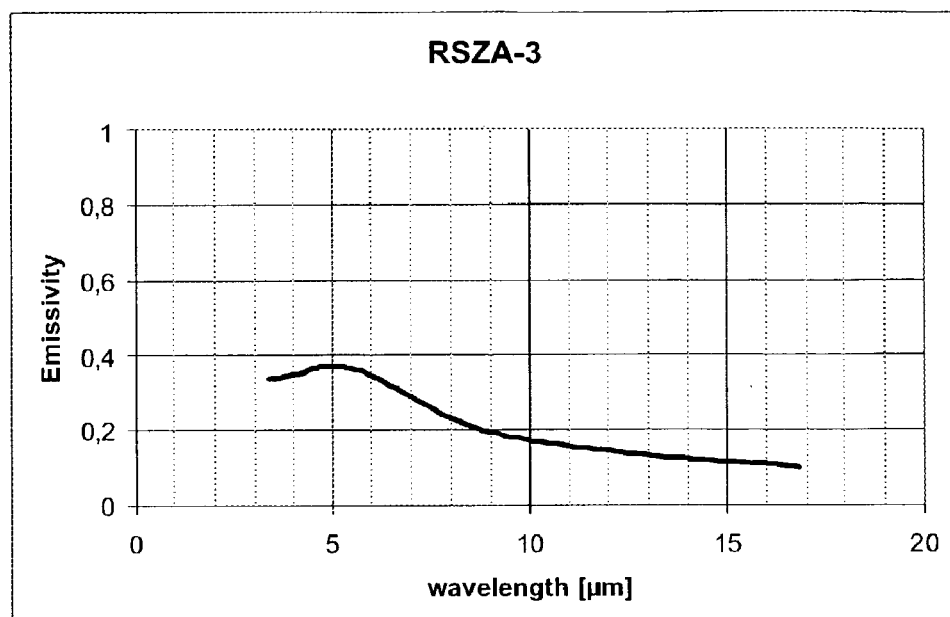
FIG. 3 shows the emissivity in the infrared obtained for the production of the first prototype of the composite for the purposes of the invention.

The attached FIG. 3 shows the emissivity in the infrared of the product described in this example: the sample shows an average value lower than 0.4 in the mid-infrared and lower than 0.2 in the far-infrared bands.

To determine the optical properties in the visible, product colorimetric measurements were taken. With reference to the various possible criteria to define the colour of an object, we adopted those in regulation ASTM E308-94 "Standard Practice for Computing the Colours of Objects by Using the CIE System". In such space, the colour is defined by three co-ordinates, L*, a* and b*.

The first co-ordinate, L*, is named Clarity Factor and it considers the luminosity of the object: as it increases from 0 to 100 the colour goes from black to white. The other two co-ordinates, ranging from −60 to +60, identify the actual colour of the object and are called Chromatic Co-ordinates.

From the calorimetric measurement shown in Table II, it is clear that the product's colour is light grey.

TABLE II

| L* | a* | b* |
|---|---|---|
| 68.4 | −2.3 | −0.9 |

Example 2

(Aluminum-alloy-based Product, with Zinc Oxide Coating, Doped with Aluminum (AZO))

The product was obtained using a procedure that will be described in details below, employing the evaporation PVD technology. In this example as well, such procedure was optimised considering the three general conditions described in Example 1.

The product was obtained using the PVD evaporation technology as follows:

Chemical cleaning of the base material

Ion bombardment

Deposition of a layer of zinc and aluminum; evaporated by using an electronic gun.

Table I shows the process parameters used for the deposition of the product described above, by alternating the beam's action on the two crucibles containing zinc and aluminum, so that a layer of a 97%-zinc-and-3%-aluminum alloy may be deposited.

Table III shows the process parameters used for the deposition of the product described above.

TABLE III

| Substrate | Coating material | Ion bombardment | | Deposition | | EB Power (Kw) |
| | | Time (min.) | Temperature (° C.) | Time (s) | Temperature (° C.) | |
|---|---|---|---|---|---|---|
| Al 2024 | Zn + Al | 23 | <150 | 12 | <150 | 58 |

Figure 4:
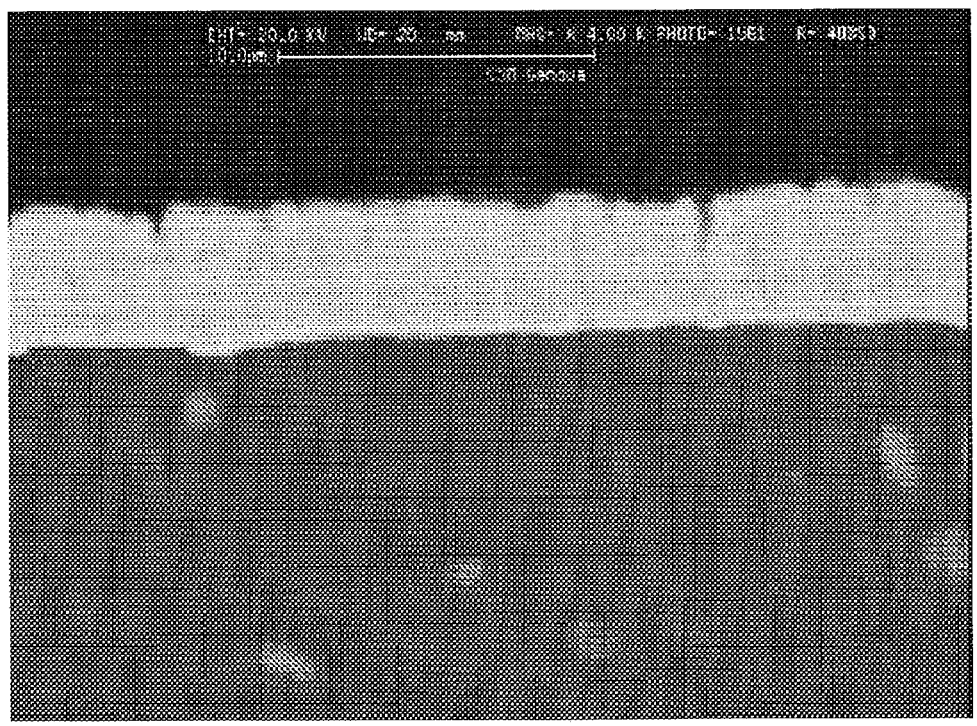
FIG. 4 shows a section microphotograph obtained for the production of the second prototype of the composite for the purposes of the invention viewed using the SEM (Scanning Electron Microscopy).

The attached FIG. 4 shows a microphotograph of the section of the product, as described in this example, viewed using SEM (Scanning Electron Microscopy).

The intermediate layer of zinc and aluminum, obtained by using EB-PVD, on the surface of which the AZO surface layer was developed, is evident.

Figure 5:
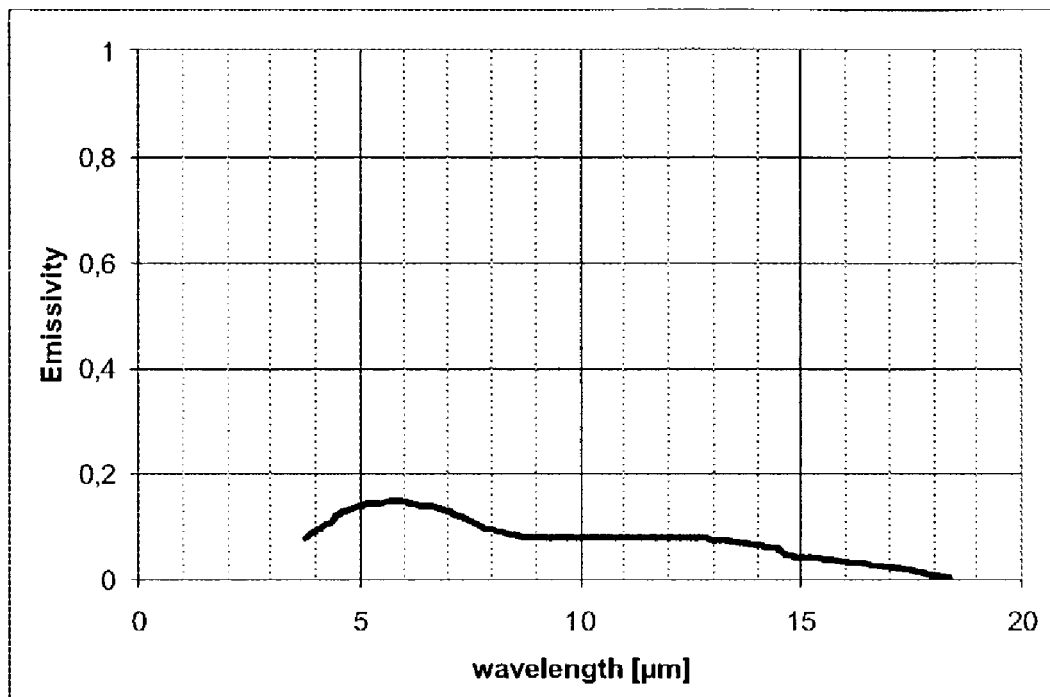
FIG. 5 shows the emissivity in the infrared obtained for the production of the second prototype of the composite for the purposes of the invention.

The attached FIG. 5 shows the emissivity in the infrared of the product described in this example: the sample shows an average value lower than 0.2 in the mid- and far-infrared.

To determine the optical properties in the visible, product calorimetric measurement were taken, assessing the colour by using the same criterion described in Example 1 above.

From the colorimetric measurement shown in Table IV, it is clear that the product's colour is light grey.

TABLE IV

| L* | a* | b* |
|---|---|---|
| 53.4 | 0.1 | −1.8 |

Example 3

(Aluminum-alloy-based Product, with Indium-oxide-based Coating, Doped with Tin (ITO) and Intermediate Layer of Tungsten Oxide)

The product was obtained as follows:

Deposition, by using PVD sputtering, of a Tungsten Oxide layer (WO3);

Deposition, by using PVD sputtering, of an Indium Oxide layer, doped with 10% of Tin (ITO).

Table V shows the process parameters used for the deposition of the two layers.

The attached FIG. 6 FIG. 6 shows the emissivity in the infrared of the product shown in this example: the sample shows an average value lower than 0.2 in the mid- and far-infrared.

TABLE V

| Material | Potential (V) | Bias (V) | Deposition Time (minutes) |
|---|---|---|---|
| WO$_3$ | 600 | 5.5 | 45 |
| ITO | 550 | 5.5 | 20 |

To determine the optical properties in the visible and near-infrared, reflexivity measurements were taken on the product, the results of which are shown in the attached FIG. 7: the sample shows an average value lower than 0.2 in the visible and lower than 0.3 in the near infrared.

Example 4

(Aluminum-alloy-based Product, with Indium-oxide-based Coating Doped with Tin (ITO) and Intermediate Layer of Aluminum Oxide)

The product was obtained as follows:

Construction, using anodic oxidation, of an aluminum-oxide layer;

Deposition, by using PVD sputtering, of an indium oxide layer doped with 10% of tin (ITO).

The anodic oxidation treatment consists of inducing, using galvanisation, a layer of porous aluminum; the component is subsequently immersed in a bath containing substances that react with the oxide and form dark-coloured compounds. In this example, inorganic substances have been employed as the colouring agent.

The parameters employed for the deposition of the ITO layer are the same as shown in Table V of Example 3.

Figure 8:
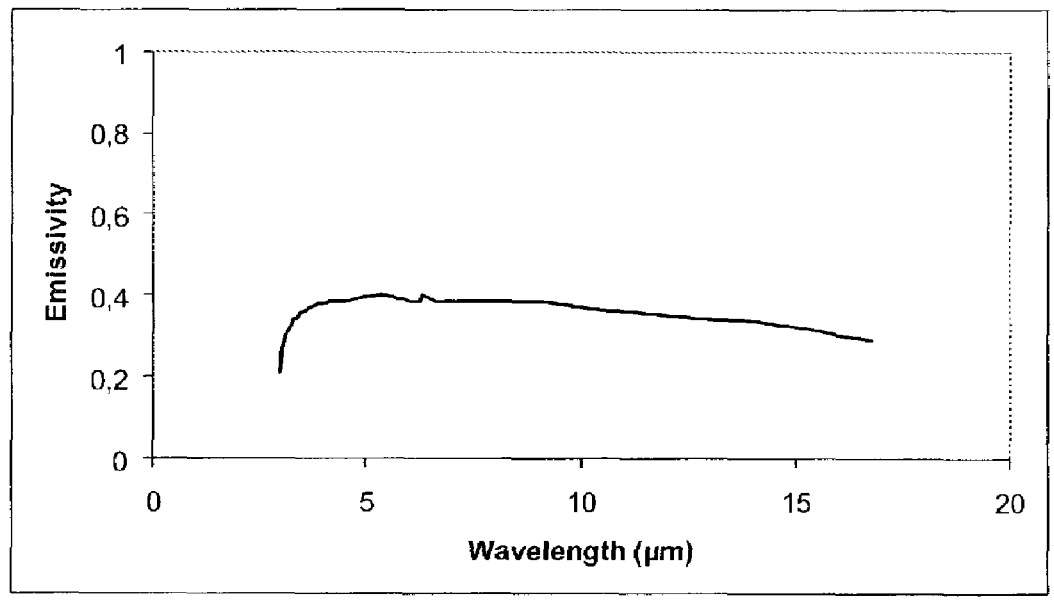
FIG. 8 shows the emissivity in the infrared obtained for the production of the fourth prototype of the composite for the purposes of the invention.

The attached FIG. 8 shows the emissivity in the infrared of the product described in this example: the sample shows an average value lower than 0.4 in the mid- and far-infrared.

Figure 9:
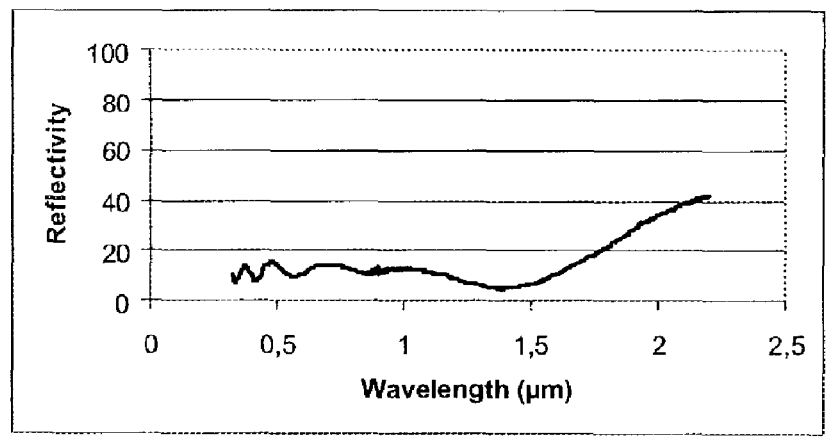
FIG. 9 shows the outcome of the reflectivity measurements taken for the production of the fourth prototype of the composite for the purposes of the invention.

To determine the optical properties in the visible and near-infrared bands, the product was subjected to reflexivity measurements, the results of which are shown in the attached FIG. 9: the sample shows an average value lower than 0.2 in the visible and lower than 0.3 in the near-infrared bands.

Persons skilled in the art, in order to satisfy further and specific needs, may introduce several additional modifications and variables of the above-described multi-layer composite product featuring low emissivity in the infrared and high emissivity in the visible, as well as modifications and variables of the related production procedures.

The invention claimed is:

1. A multi-layer composite product, featuring emissivity levels lower than 0.4 in the mid-infrared, wavelength range 2,5–5 µm, and far-infrared bands, wavelength range 8.0–14.0 µm, as well as reflectivity lower than 0.3 in the visible, wavelength range 0.3–0.7 µm, and the near-infrared bands, wavelength range 0.7–2.5 µm, and featuring the inclusion of a base constructed using low-density and/or high thermal-resilience structural materials, coated with a coating, wherein the low density and high-thermal-resilience structural material is a composite with carbon fibers, and wherein said coating consists of an outer layer made of a material selected from the group consisting of $In_2O_3$ doped with tin, $CdIn_2O_4$, $Zn_2In_2O_5$, ZnO doped with aluminum, ZnO doped with tin, $SnO_2$ doped with antimony, $SnO_2$ doped with fluorine and CdO doped with tin, and an intermediate layer made of a material selected from a group consisting of indium, cadmium, zinc, tin, aluminum, antimony or their alloys, oxides of metals selected from the group consisting of indium, cadmium, tin, aluminum, titanium, tungsten, which are optionally doped with elements selected from the group consisting of tin, aluminum, antimony and fluorine.

* * * * *